United States Patent [19]

Baranov et al.

[11] Patent Number: 4,491,683

[45] Date of Patent: Jan. 1, 1985

[54] SOLAR PHOTOELECTRIC MODULE

[76] Inventors: Vladimir K. Baranov, ulitsa Krasnoputilovskaya, 35, kv. 45, Leningrad; Akhsarbek B. Pinov, ulitsa Ushinskogo, 60/2, Ordzhonikidze; Valery N. Potapov, Timiryazevskaya ulitsa, 13, kv. 213, Moscow; Vladimir V. Rostokinsky, Novorogozhskaya ulitsa, 11, korpus 2, kv. 27, Moscow; Stanislav V. Ryabikov, pereulok Vasnetsova, 12, kv. 64, Moscow; Viktor A. Sabelnikov, ulitsa Amundsena, 3, korpus 1, kv. 6, Moscow; Dmitry S. Strebkov, ulitsa B.Galushkina, 20, kv. 79, Moscow; Eduard V. Tveryanovich, M. Kolkhoznaya ploschad, 1, kv. 90, Moscow, all of U.S.S.R.

[21] Appl. No.: 514,697

[22] Filed: Jul. 18, 1983

[51] Int. Cl.$^3$ .............................................. H01L 31/04
[52] U.S. Cl. .................................... 136/259; 250/239; 357/81
[58] Field of Search ............... 136/259, 246; 357/81; 250/239

[56] References Cited

U.S. PATENT DOCUMENTS

| | | | |
|---|---|---|---|
| 3,004,168 | 10/1961 | Emetis | 250/211 |
| 3,899,672 | 8/1975 | Levi-Setti | 350/293 |
| 4,045,246 | 8/1977 | Mlavsky et al. | 136/246 |
| 4,144,095 | 3/1979 | Mlavsky | 136/246 |
| 4,166,917 | 9/1979 | Dorfeld et al. | 136/259 |
| 4,388,481 | 6/1983 | Uroshevich | 136/246 |

Primary Examiner—Aaron Weisstuch
Attorney, Agent, or Firm—Lilling & Greenspan

[57] ABSTRACT

A solar photoelectric module comprises a composite parabolic solar energy concentrator having an aperture angle $\alpha$ and contrived in the form of a sealed gas-filled bulb. The side walls of the bulb bend on a predetermined radius to a cylindrical part thereof beside a concentrator radiation outlet surface which is coated with an inside reflecting coating. A photoreceiver having a cooling system is arranged inside the cylindrical portion of the bulb with a gap separating it from the walls. The cooling system disposed inside the concentrator bulb comprises a metal heat sink with air cooling ribs. The invention prolongs the service life of the module, improves its dependability and efficiency, and reduces its cost.

5 Claims, 4 Drawing Figures

SOLAR PHOTOELECTRIC MODULE

FIELD OF THE INVENTION

The present invention relates to manufacture of solar power units for direct conversion of light energy to electrical energy and, more specifically, to a solar photoelectric module.

The present invention can most advantageously be used in solar power plants, particularly, in self-contained power plants designed to fulfill functions of cathodic protection, radio-relay and radiotelephone communication, water lift in arid and desert regions, etc.

BACKGROUND OF THE INVENTION

Presently, the industrialized countries have adopted national solar energy utilization programs. One of the trends in the utilization of solar energy is the construction of solar photoelectric modules incorporating solar energy concentrators.

Known in the art is a solar module with a composite parabolic solar energy concentrator and a solar receiver disposed in an outlet section and cooled by means of a liquid (cf. U.S. Pat. No. 4,045,246. The module is constructed as follows: The concentrator having a reflecting surface is contrived as a discrete assembly, the outlet cross section whereof contains a sealed chamber, with a photoreceiver disposed on the bottom thereof. The liquid circulating inside the sealed chamber operates as a heat-transfer medium. An inlet section of the concentrator is covered with a transparent material.

The liquid coolant in the space in front of the solar receiver results in high losses of light passing through the layer of liquid and in the reduction of the photoreceiver efficiency.

The joints between the concentrator and the sealed chamber wherein the receiver is disposed and the liquid is circulating and between the concentrator and the transparent material in the inlet section neither provide for reliable sealing of the concentrator reflecting surface nor prevent environmental effects. The result is that the properties of the concentrator reflecting surface are impaired and the concentrator's efficiency is decreased.

There is known a solar energy collector whose basic component is a composite parabolic concentrator with an aperture angle α (cf. U.S. Pat. No. 3,899,672).

This prior-art collector is designed as follows: A spherical surface member mounts a plurality of discrete composite parabolic solar energy concentrators. The spherical member accommodates conduits filled with heat-transfer medium. The concentrators are disposed on the surface of the spherical member in such a way as to locate the heat-transfer medium conduit in the outlet section.

The foregoing construction does not permit protecting the concentrator reflecting surface against dust, moisture and air, with the result that the optical efficiency of the concentrators and the service lives thereof are substantially reduced.

There is also known a solar photoelectric module (cf. U.S. Pat. No. 4,166,917) comprising a composite parabolic solar energy concentrator with an aperture angle α, designed in the form of a sealed transparent bulb filled with gas and provided with a reflecting coating on the side walls which are bent on a predetermined radius to a cylindrical part of the bulb near the concentrator radiation outlet surface. The photoreceiver of the module is located near the concentrator radiation outlet surface and is equipped with a cooling system.

A metal bus disposed on a face side of the photoreceiver in the module operates as a heat and current conductor; the taper part of the bus constitutes a part of the design reflecting surface. A U-shaped metal bus disposed on the back side of the photoreceiver also serves as a current and heat conductor. Both buses are connected to electrodes which are sealed into the glass of the cylindrical part of the concentrator. In turn, the electrodes are connected to the external part of the cooling system.

The cooling system arranged outside of the sealed bulb is exposed to corrosion due to environmental effects. As a result the service life of the module is shortened.

Since heat emitted by the photoreceiver is sunk through the electrodes, the thermal energy is unevenly distributed in the receiver because heat is removed only at several points. Consequently, the efficiency and service life of the photoreceiver is decreased.

The use of several heat and electrical junctions, the location of the cooling system outside of the concentrator, and the need for accurate mating of the glass and metal taper surfaces bring about complications in construction and assembly of the module.

Considering the use of current- and heat-conducting electrodes made of high-alloy materials with quite a large cross-sectional area, the demand in said materials (including tungsten, molybdenum and cobalt) is high.

SUMMARY OF THE INVENTION

It is an object of the present invention to provide a solar photoelectric module, wherein the arrangement of the photoreceiver in the concentrator and the structural features of the photoreceiver cooling system will prolong the service life of the module, and improve its efficiency and dependability.

The invention is a solar photoelectric module comprising a composite parabolic solar energy concentrator having an aperture angle α and constructed in the form of a sealed gas-filled bulb bearing an inside reflecting coating on the side walls. The walls bend on a predetermined radius toward a cylindrical part of the bulb beside a concentrator radiation outlet surface. A photoreceiver disposed beside the concentrator radiation outlet surface incorporates a cooling system. According to the invention, the photoreceiver and the cooling system thereof in the form of a metal heat sink with air cooling ribs are arranged inside the cylindrical part of the bulb and separated by a gap from the walls thereof to permit a convective flow of gas which fills the bulb.

For improving heat removal from the photoreceiver and ensuring full tightness of the module, it is preferable that the photoreceiver cooling system be devised in the form of a metal heat sink shaped as a cylindrical sleeve, the bottom whereof mounts the photoreceiver bearing a heat-conducting layer, and the side walls are slotted.

For improving the convective heat removal from the photoreceiver with the degree of concentration of the radiation on the photoreceiver increased, it is expedient that the photoreceiver cooling system be designed as a metal heat sink in the form of a body of revolution carrying radial ribs.

To minimize the losses of solar energy in the gap, and to improve distribution of energy over the photoreceiver, it is preferable that the photoreceiver be located in the concentrator bulb cylindrical part at a distance h from the radiation outlet surface, with the value h not less than $2\Delta/tg\alpha$, where $\Delta$ is the gap between the photoreceiver and the bulb walls, and $\alpha$ is the aperture angle.

In addition, for precluding losses of light due to multiple reflection of rays from the reflecting surface of the concentrator bulb cylindrical part, it is necessary that the predetermined radius on which the side walls bend to the concentrator bulb cylindrical part should lie in the range given by $$\delta < r < R,$$

where:
 r is the radius on which the side walls bend to the concentrator bulb cylindrical part;
 $\delta$ is the wall thickness of the concentrator bulb;
 R is the radius of the concentrator bulb cylindrical part.

BRIEF DESCRIPTION OF DRAWINGS

The invention will be described further, by way of examples, with reference to the accompanying drawings, wherein.

DETAILED DESCRIPTION OF THE INVENTION

Figure 1:
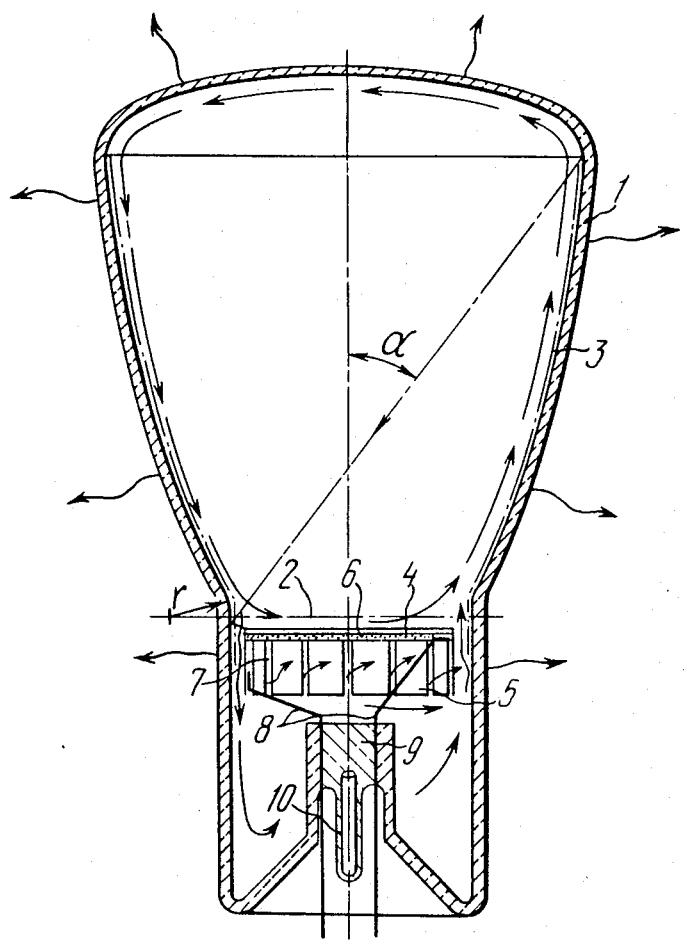
FIG. 1 is a longitudinal sectional view of a solar photoelectric module incorporating a composite parabolic solar energy concentrator, according to the invention.

Referring to FIG. 1, the solar photoelectric module according to the present invention comprises a composite parabolic glass solar energy concentrator having an aperture angle $\alpha$ and contrived in the form of a sealed transparent bulb 1. An internal surface of the side walls in the bulb 1 bends on a predetermined radius r to a cylindrical part beside a concentrator radiation outlet surface 2 and bears a reflecting coating 3. The cylindrical part of the bulb 1 accommodates a photoreceiver 4 equipped with a cooling system in the form of a metal heat sink 5. The heat sink 5 is essentially a cylindrical sleeve, the bottom whereof mounts the photoreceiver 4 provided with a heat-conductive dielectric layer 6, and the side walls thereof are provided with slots 7. The heat sink 5 is attached to electrodes 8 operating as current conductors and sealed into a stem 9 made of material identical to that of the concentrator bulb 1. An exhaust tube 10 located in the stem 9 serves for evacuating the bulb 1 and filling it with gas. The bulb 1 is filled with gaseous hydrogen fulfilling the function of inert gas and cooling medium.

Figure 2:
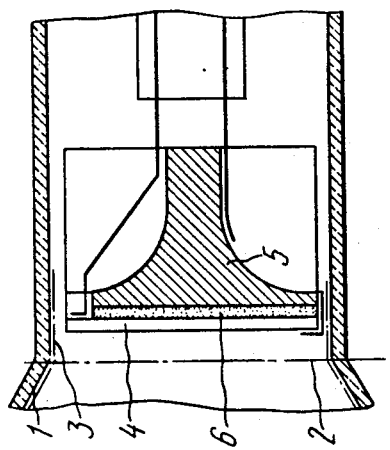
FIG. 2 is a longitudinal sectional view of a photoreceiver cooling system heat sink in the form of a body of revolution equipped with radial ribs, according to the invention.
Figure 3:
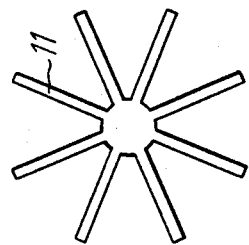
FIG. 3 is a cross sectional view of the heat sink in the form of a body of revolution, according to the invention.

Turning now to FIG. 2, the metal heat sink 5 of the cooling system of photoreceiver 4 can be designed as a body of evolution carrying radial ribs 11 (FIG. 3). The heat sink 5 is made of light-weight high thermal conductivity metal.

Figure 4:
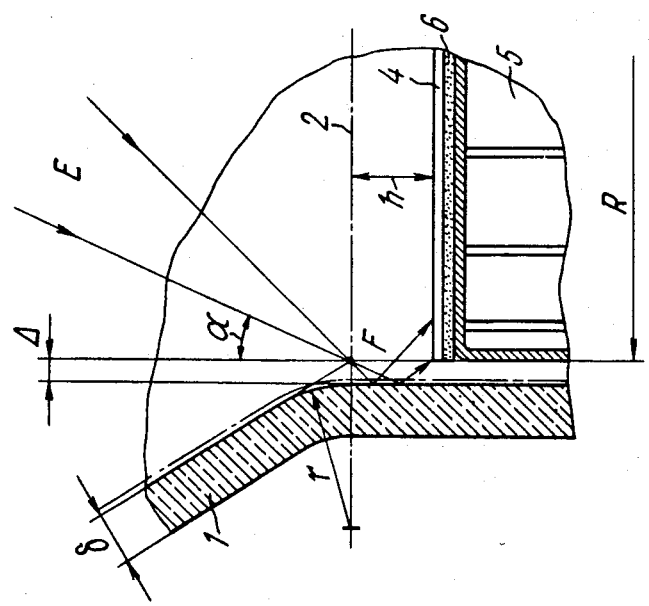
FIG. 4 shows an arrangement of the photoreceiver and heat sink of the cooling system thereof relative to a concentrator radiation outlet surface, according to the invention.

The photoreceiver 4 (FIG. 4) is arranged inside the cylindrical part of the concentrator bulb 1 at a distance h from the concentrator radiation outlet surface 2, with the value h equal to at least $2\Delta/tg\alpha$. The photoreceiver 4 is arranged in the cylindrical part of the bulb 1 in such a way that the photoreceiver 4 and heat sink 5 are separated from the walls of the bulb 1 by a circular gap $\Delta$ intended to permit the convective flow of gas filling the bulb 1. The side walls of the bulb 1 bend toward the cylindrical part thereof on a predetermined radius r, whose center lies on the radiation outlet surface 2 and whose magnitude is in the range $\delta < r < R$, where $\delta$ is the wall thickness of the bulb 1 and R is the radius of the cylindrical part of the bulb 1. The bending radius r must exceed the wall thickness $\delta$ for manufacturing reasons since otherwise internal stresses occuring in the material in the area of the bend of the bulb 1 sharply increase The radius r of the bend must be less than the radius R of the cylindrical part of the bulb 1 since otherwise the circular gap $\Delta$ notably increases along with the losses of light therein that can be precluded only by increasing the distance from the concentrator radiation outlet surface 2 to the photoreceiver 4. The increase in the distance leads to further losses of light due to increased reflection by the walls of the cylindrical part of the bulb 1, and also results in higher concentration of radiation across single spots of the photoreceiver detrimental to operating conditions of the photoreceiver 4.

The solar photoelectric module of the present invention operates as follows.

Solar radiation incident on the photoreceiver 4 (FIG. 1) located beside the radiation outlet surface 2 is directed thereupon either directly or by reflection from the coating 3. Some energy of solar radiation incident on the photoreceiver 4 is converted to electrical energy which is supplied to a consumer through the electrodes 8. Another portion of the radiant energy is spent for undesirable heating of the photoreceiver 4. A certain portion of heat is transferred by the convective flow of the gaseous coolant to the walls of the concentrator bulb 1 and is given up to the environment. Another portion of heat is transferred from the photoreceiver 4 by the heat-conductive dielectric layer 6 to the metal heat sink 5 by the air cooling ribs incorporated in the cooling system of the photoreceiver 4. The gaseous coolant flowing around the heat sink 5 carries heat away from the heat sink 5 to the entire interior space of the concentrator bulb 1 using the circular gap $\alpha$ (FIG. 4) and heating the walls of the bulb 1 which give heat up to the environment.

The design surface of the composite parabolic concentrator terminates at a point F (FIG. 4) which is imaginary. Solar radiation E passes through the point F of the design surface 2 where radiation is emitted from the composite parabolic concentrator in compliance with the operating principle of this type of concentrator, provided that the radiation E lies within the aperture $\alpha$. After that, a part of solar radiation E falls on the reflecting surface coating 3 of the cylindrical part of the bulb 1, which reflects and directs it to the photoreceiver 4 located at the distance h from the radiation outlet surface 2, with the value h equal to at least $2\Delta/tg\alpha$. If h is less than $2\Delta/tg\alpha$, the radiation E incident on the reflecting coating 3 of the cylindrical part of the bulb 1 under the angle $\alpha$ will miss the photoreceiver 4 and will pass to the gap $\Delta$.

Reflection of the radiation E by the cylindrical part of the bulb 1 improves the distribution of energy across the photoreceiver 4 which, in turn, improves the efficiency of energy conversion and the operation of the cooling system. The radius r of the bend is chosen in the range $\delta < r < R$. This feature maintains the gap $\Delta$ required for efficient operation of the cooling system of the photoreceiver 4 and at the same time notably reduces the losses of solar radiation E in the concentrator.

If the value r is less than the wall thickness $\delta$ of the bulb 1, high internal stresses occur in the material and may bring about cracking of the bulb 1. If the value r is increased to the value R, the gap $\Delta$ and, hence, the distance h increase which results in multiple reflections of the radiation E by the walls of the cylindrical part of the bulb 1 and in higher losses of light.

Thus, resistance of the material of the concentrator bulb 1 to atmospheric effects, and full tightness of all the systems of the module, that is, the concentrator reflecting surface, photoreceiver 4 and cooling system thereof will substantially prolong the service life of the module according to the invention.

The simple construction of the module and the minimum number of joints between materials of different linear expansion coefficients contribute to higher dependability of all the systems of the module and to lower costs of manufacture.

With the photoreceiver 4 disposed in the cylindrical part of the concentrator bulb 1 in a definite position relative to the radiation outlet surface 2, the losses of light and radiant energy can be reduced under certain operating conditions of the module, whereby the efficiency of the module as a whole can be improved.

What is claimed is:

1. A solar photoelectric module, comprising:
   a composite parabolic solar energy concentrator having an aperture angle $\alpha$ and a radiation outlet surface and comprising a sealed gas-filled bulb,
   side walls and a cylindrical part of said bulb bending to each other on a predetermined radius;
   an inside reflecting surface applied to said side walls of said bulb;
   a photoreceiver disposed inside said cylindrical part of said bulb, separated from the walls of said bulb by a gap and located beside said radiation outlet surface; and
   a cooling system of said photoreceiver comprising a metal heat sink with air cooling ribs and separated from the walls of said bulb by a gap to permit convective flow of gas which fills said bulb.

2. A solar photoelectric module according to claim 1, wherein said cooling system of said photoreceiver comprises a metal heat sink shaped as a cylindrical sleeve, the bottom of said heat sink which mounts said photoreceiver being coated with a heat-conducting layer, and the side walls of said heat sink being provided with slots.

3. A solar photoelectric module according to claim 1, wherein said cooling system of said photoreceiver comprises a metal heat sink shaped as a body of revolution carrying radial ribs.

4. A solar photoelectric module according to claim 1, wherein said photoreceiver is disposed inside said cylindrical part of said concentrator bulb at a distance h fom said outlet radiation surface of said concentrator, with h equal to at least $2\Delta/tg\alpha$, where:
   $\alpha$ is said aperture angle; and
   $\Delta$ is said gap between the walls of said cylindrical part of said bulb and said photoreceiver.

5. A solar photoelectric module according to claim 1, wherein a center of said radius on which said side walls bend to said cylindrical part of said concentrator bulb is located on said radiation outlet surface of said concentrator, and said radius lies in the range:

$$\delta < r < R,$$

where:
   r is said radius of bend;
   $\delta$ is the wall thickness of said bulb of said solar energy concentrator; and
   R is the radius of said cylindrical part of said solar energy concentrator bulb.

* * * * *